United States Patent [19]
Goebel et al.

[11] Patent Number: 5,766,973
[45] Date of Patent: Jun. 16, 1998

[54] METHOD FOR MANUFACTURING A SEMICONDUCTOR ARRANGEMENT BY INTRODUCING CRYSTAL DISORDER STRUCTURES AND VARYING DIFFUSION RATES

[75] Inventors: Herbert Goebel; Vesna Goebel, both of Reutlingen, Germany

[73] Assignee: Robert Bosch GmbH, Stuttgart, Germany

[21] Appl. No.: 732,758

[22] Filed: Oct. 18, 1996

[30] Foreign Application Priority Data

Oct. 19, 1995 [DE] Germany ............... 195 38 853.4

[51] Int. Cl.$^6$ ............................................. H01L 21/225
[52] U.S. Cl. ................... 437/151; 148/DIG. 174; 437/228; 437/904
[58] Field of Search ........................... 437/149, 150, 437/151, 153, 225, 228, 904; 148/DIG. 174

[56] References Cited

U.S. PATENT DOCUMENTS

| | | |
|---|---|---|
| 4,738,936 | 4/1988 | Rice ............................ 437/225 |
| 4,740,477 | 4/1988 | Einthoven et al. ........... 437/904 |
| 4,775,643 | 10/1988 | Wetteroth ............... 148/DIG. 174 |

FOREIGN PATENT DOCUMENTS 43 20 780   3/1995   Germany.

*Primary Examiner*—Chandra Chaudhari
*Attorney, Agent, or Firm*—Kenyon & Kenyon

[57] ABSTRACT

In a semiconductor arrangement and a method for manufacturing a semiconductor arrangement, varying diffusion rates are attained by introducing crystal disorder structures into a silicon crystal. The semiconductor structure includes a semiconductor wafer which has a first layer and a second layer, which form a p-n junction. Because the diffusion rates vary, the gradient of the dopant concentration of the second layer in the edge area is greater (merely) than in the middle area. As a result, a breakdown of the p-n junction in the edge area is reached at higher voltages than in the middle area.

3 Claims, 2 Drawing Sheets

METHOD FOR MANUFACTURING A SEMICONDUCTOR ARRANGEMENT BY INTRODUCING CRYSTAL DISORDER STRUCTURES AND VARYING DIFFUSION RATES

FIELD OF THE INVENTION

The present invention relates to a semiconductor arrangement and to a method for manufacturing the semiconductor arrangement.

BACKGROUND INFORMATION

A semiconductor arrangement and a method for manufacturing the semiconductor arrangement are described in German Patent Application No. 43 20 780. The German Application describes an arrangement having a silicon chip with an n-type doped layer and a p-type doped layer arranged thereon. In the middle area of the chip, the n-type doped layer is more heavily doped, so that a reduced breakdown voltage ensues there between the p-type doped layer and the n-type doped layer. Thus, a semiconductor diode is created, where a breakdown preferably takes place in the middle region. In the method according to the present invention, a more heavily n-type doped layer is deposited on a weakly n-type doped layer. By introducing sawed trenches, which penetrate through the more heavily n-type doped layer, the more heavily n-type doped layer is removed in individual regions. When the p-type doped layer is subsequently produced and dicing then takes place in the area of the sawed-in trenches, it is ensured that no p-n junction is situated in the edge areas between the p-type doped layer and the more heavily n-type doped layer.

SUMMARY OF THE INVENTION

One of the advantages of the semiconductor arrangement according to the present invention is a simpler workability and the use of a homogeneously doped first layer. Thus, newly created semiconductor components have a p-n junction with a superior blocking (rectifying) capability, whose breakdown property is able to be readily adjusted, because there is no breakdown of the p-n junction in the edge area because of the larger gradient of the dopant concentration being situated there. Therefore, the breakdown properties of the p-n junction are able to be controlled quite efficiently using simple means. Furthermore, a relatively large dopant concentration can be used for the first layer due to the homogenous doping. Therefore, the first layer has an especially low resistance. The method for manufacturing a semiconductor arrangement according to the present invention has the advantage of requiring comparatively few process steps for manufacturing the semiconductor arrangement. Also, the method according to the present invention does not have to be performed inside a clean room, so that manufacturing costs are reduced. The resistance of the first layer can be further reduced by baking a heavy doping into the bottom side of the first layer. Crystal disorder structures (damages) are introduced by means of sawing. Recesses then form in the edge area of the semiconductor arrangements.

DETAILED DESCRIPTION

Figure 1:
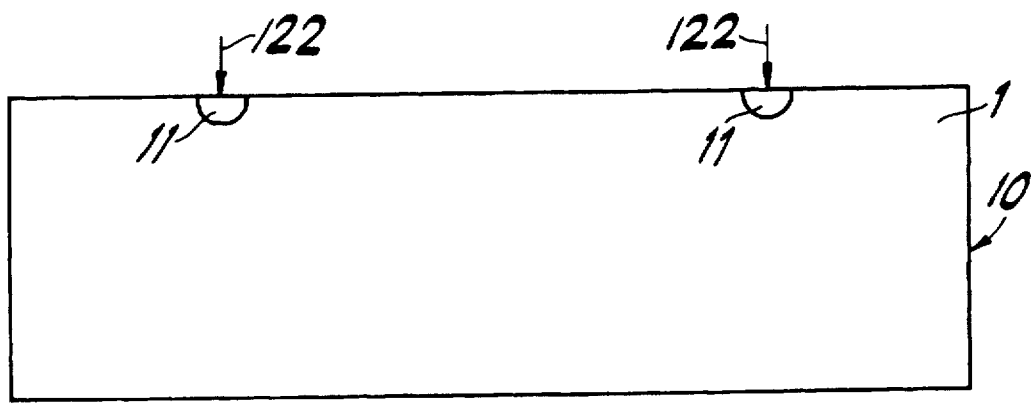
FIG. 1 illustrates first steps for a first manufacturing method according to the present invention.

FIG. 1 shows a monocrystalline semiconductor substrate 10, which is comprised of a first silicon layer 1. Crystal disorders 11 are introduced into the top side of this first silicon layer 1. These crystal disorders 11 affect regions of the first silicon layer 1 where the monocrystalline crystal structure is disturbed. Crystal disorder 11 of this type can be introduced, for example, through mechanical action, such as scribing and sawing, or by using ultrasonic tools. In addition, disorder structures (imperfection) can be produced in the crystal by a plurality of beams. For example, X-rays or electron beams can be used for such purpose. Another way to produce disorder in crystal is through ion- or agonion implantation, for example. Arrows 122 illustrate the effect of crystal disorders 11 being introduced into the silicon layer 1. Other processes which produce the appropriate crystal disorder in the top surface of the first silicon layer 1 can also be used.

Figure 2:
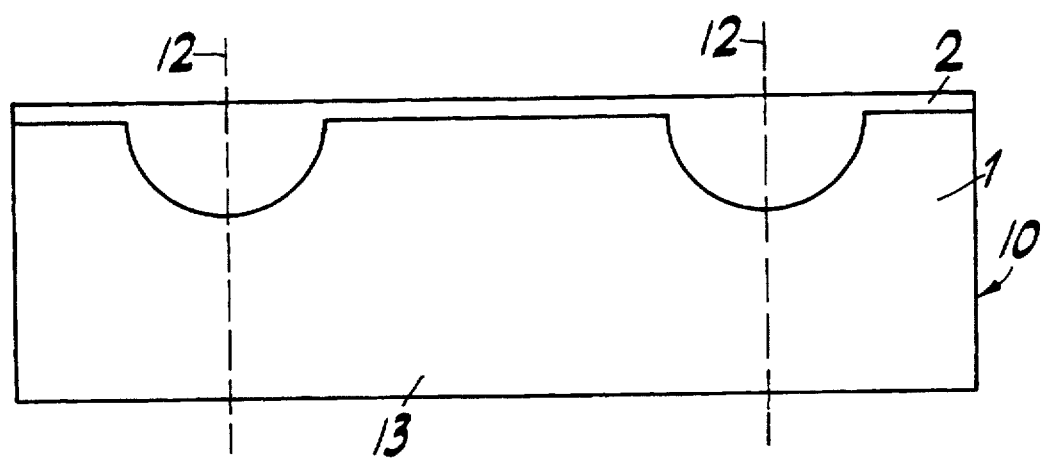
FIG. 2 illustrates second steps for the first manufacturing method according to the present invention.

In a further step shown in FIG. 2, a second silicon layer 2 of an opposite conductivity type is then introduced using a diffusion process into the first silicon layer 1. For example, the first silicon layer 1 is of the n-type and the second silicon layer 2 of the p-type. During the diffusion process, a dopant is applied to the top side of the first silicon layer 1; then the dopant penetrates under elevated temperatures through a diffusion process into a first silicon layer 1, therefore producing a p-type doping. The diffusion process takes place in the monocrystalline regions of the silicon layer 1 at a lower rate than in regions formed by the crystal disorder structures 11 having crystal imperfections. FIG. 2 shows a cross-section through the semiconductor substrate 10 after the diffusion step (or process) has completed. FIG. 2 illustrates that in the regions where the crystal disorder (damaged) structures 11 exist prior to the diffusion step, the p-dopant has penetrated much further into the first semiconductor layer. Since the same dopant concentration existed on the surface of layer 1 for all regions, therefore the same quantity of dopant is distributed over a substantially greater volume, i.e., the dopant gradient is substantially smaller than in those regions where diffusion into the monocrystalline silicon took place.

The diffusion process takes place at elevated temperatures, e.g., 1200° C., for restoring a damaged crystal. To ensure that the crystal disorder structures 11 lead to a gradient in the edge area which is as small as possible, the diffusion process preferably achieves a depth diffusion before the crystal disorders are corrected with annealing. This can be achieved with a shortest possible diffusion process, e.g., through a high dopant concentration on the surface and high diffusion temperatures.

In the further processing, cuts are introduced along dividing lines 12 to dice the semiconductor substrate 10 into individual silicon wafers 13. In this case, the crystal disorders 11 were completely formed along dividing lines 12, so that the edge areas of the silicon wafers 13 are completely formed by one area in which the p-type diffusion has penetrated further into the first layer than in the middle area. A p-n junction is created by the first layer 1 and the second layer 2. When the p-n junction is reverse-biased, a breakdown of the p-n junction takes place when a specific voltage is exceeded. What is problematic is when the p-n junction occurs in the edge area, since no exact voltage value is able to be set for the breakdown in this area because of accumulated contamination or because of surface effects. In addition, because of the mentioned effects, the breakdown voltage in the edge area is less than in the middle area. Therefore, it must be ensured that the breakdown of the p-n junction does not take place in the edge area, but rather in the middle area. This is achieved in German Patent Application No. 43 20 780 in that the middle area is more heavily doped than the edge area, so that the breakdown voltage in the middle area is less than in the edge area. In the present invention, the breakdown voltage of the p-n region in the edge area is increased in that the gradient of the dopant concentration, i.e., the change in the dopant concentration of the second layer 2 in the edge area is less than the change of the dopant concentration in the middle area. The breakdown voltage of a p-n junction is also influenced by the gradient and becomes greater when the gradient becomes smaller. Therefore, a breakdown of the p-n junction can only take place in the middle area and not in the edge area of the semiconductor wafer.

Figure 3:
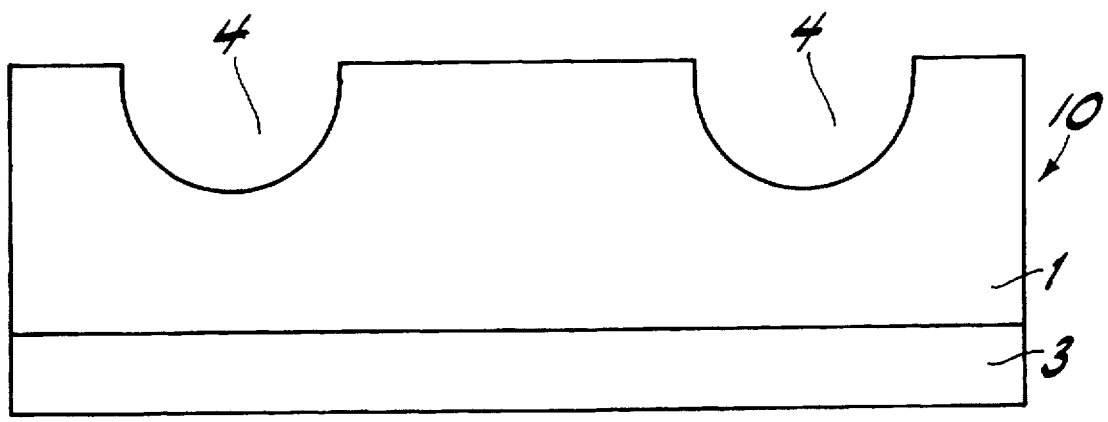
FIG. 3 illustrates first steps for a second manufacturing method according to the present invention.
Figure 4:
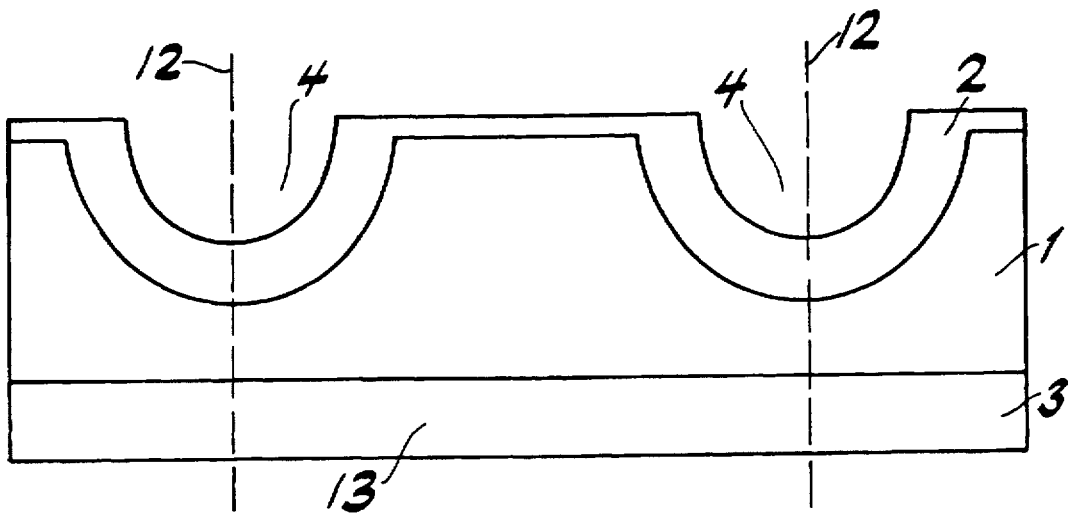
FIG. 4 illustrates second steps for the second manufacturing method according to the present invention.

The structure shown in FIGS. 1 and 2 can also be used as a diode, and in particular as a Zener diode. However, other components which have a p-n junction are conceivable. A further advantage of the method according to the present invention as described in FIGS. 1 and 2 is that the semiconductor elements do not have to be processed in a clean room. Both the introduction of the crystal disorders 11 and the diffusion step.,(or process) can take place outside of a clean room. Therefore, the method according to the present invention is particularly cost-effective. FIGS. 3 and 4 show a second exemplary embodiment of the method according to the present invention. FIG. 3 illustrates a cross-section through a semiconductor substrate 10, which has a first silicon layer 1. A heavily doped layer 3, which has the same conductivity as first silicon layer 1, is introduced into the bottom side. Trenches 4 are introduced using a mechanical machining process into the top side of silicon layer 1. The trenches 4 can be introduced, for example, by means of sawing, milling, grinding, or a similar method. In an area around trenches 4, the crystal structure of the first silicon layer 1 is disturbed (rearranged). To considerably enhance this effect, a saw blade or a milling tool with an especially rough granularity of the diamond particles is used, as a rule, for working with a silicon. As a result, a plurality of disorder structures is introduced into the crystal lattice of the first silicon layer 1 in the area surrounding trenches 4.

The structure thus formed is shown in FIG. 4 following a diffusion step. A dopant that constitutes one conductivity type, which is the opposite of the conductivity type of the first layer 1, is introduced into the top side of silicon layer 1. For example, the first layer 1 is of the n-conductivity type, and the second layer 2 formed by diffusion is of the p-conductivity type. Thus, in the area of trenches 4, the p-layer has a substantially smaller gradient than in the middle area. This ensures that a breakdown of the p-n junction between the first layer 1 and the second layer 2 takes place exclusively in the middle area of the semiconductor wafer which is formed by dicing substrate 10 along separating lines 12.

The rear-side doping (heavily-doped region) 3 shown in FIGS. 3 and 4 serves to further reduce the resistance of a thus formed diode. It is also possible to eliminate the heavily-doped region (layer) 3 when the first layer 1 is amply doped.

The top and bottom side can also each be metallized prior to the dicing operation illustrated in FIGS. 2 and 4. Immediately following the dicing operation, a component of this type can then be used as a Zener diode, lead wires for contacting the diode being provided in each case on the top and bottom sides.

What is claimed is:

1. A method for manufacturing a semiconductor arrangement, comprising the steps of:

coating a surface of a semiconductor substrate using at least one dopant element to provide a first layer having a first dopant type, the semiconductor substrate having edge areas;

providing crystal disorder structures into the first layer at the edge areas, the edge areas having damaged regions and undamaged regions;

diffusing a second layer having a second dopant type into the first layer to form a p-n junction between the first layer and the second layer, the second layer being diffused in the damaged regions more rapidly than in the undamaged regions; and dicing the semiconductor substrate at the edge areas of the semiconductor substrate.

2. The method according to claim 1, wherein the crystal disorder structures are produced using at least one of a mechanical machining process, a foreign impurity particles implantation process, and an irradiation process.

3. The method according to claim 1, wherein the first layer has a substantially uniform dopant concentration.

* * * * *